(12) United States Patent
Chai et al.

(10) Patent No.: US 7,846,618 B2
(45) Date of Patent: Dec. 7, 2010

(54) MULTI-TONE OPTICAL MASK, METHOD OF MANUFACTURING THE SAME AND METHOD OF MANUFACTURING THIN-FILM TRANSISTOR SUBSTRATE BY USING THE SAME

(75) Inventors: Chong-Chul Chai, Seoul (KR); Soo-Wan Yoon, Gyeonggi-do (KR); Shi-Yul Kim, Gyeonggi-do (KR); Joo-Ae Youn, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 532 days.

(21) Appl. No.: 11/784,406

(22) Filed: Apr. 5, 2007

(65) Prior Publication Data

US 2008/0026299 A1    Jan. 31, 2008

(30) Foreign Application Priority Data

Jul. 28, 2006   (KR) .................. 10-2006-0071251

(51) Int. Cl.
*G03F 1/00* (2006.01)
*G03F 7/00* (2006.01)
(52) U.S. Cl. ..................... 430/5; 430/311; 430/322
(58) Field of Classification Search ............. 430/5, 430/311, 322
See application file for complete search history.

(56) References Cited

U.S. PATENT DOCUMENTS

| 5,391,441 | A  | * | 2/1995 | Imai et al. ............... 430/5 |
| 6,180,290 | B1 | * | 1/2001 | Hsu et al. ................ 430/5 |
| 2002/0132173 | A1 | * | 9/2002 | Rolfson .................... 430/5 |
| 2005/0112478 | A1 | * | 5/2005 | Taravade et al. ........... 430/5 |
| 2005/0196683 | A1 | * | 9/2005 | Henke et al. .............. 430/5 |

FOREIGN PATENT DOCUMENTS

KR      2000-0047011      7/2000

OTHER PUBLICATIONS

Korean Patent Abstracts, Publication No. 1020000047011, Jul. 25, 2000, 1 p.

* cited by examiner

*Primary Examiner*—Stephen Rosasco
*Assistant Examiner*—Stewart A Fraser
(74) *Attorney, Agent, or Firm*—Innovation Counsel LLP

(57) ABSTRACT

A multi-tone optical mask includes a substrate, a light-blocking pattern, a first semi-transmitting pattern and a second semi-transmitting pattern. The light-blocking pattern is formed on the substrate. The first semi-transmitting pattern is formed on the substrate. The second semi-transmitting pattern partially overlaps the first semi-transmitting pattern. The multi-tone optical mask has at least five different light-transmittances corresponding to a plurality of areas divided on the substrate.

27 Claims, 17 Drawing Sheets

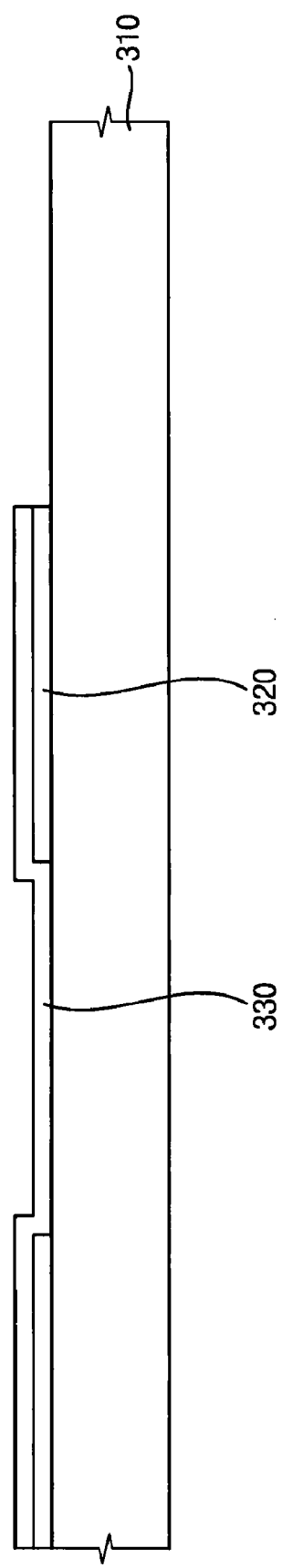

MULTI-TONE OPTICAL MASK, METHOD OF MANUFACTURING THE SAME AND METHOD OF MANUFACTURING THIN-FILM TRANSISTOR SUBSTRATE BY USING THE SAME

CROSS-REFERENCE TO RELATED APPLICATIONS

This application claims priority under 35 USC §119 to Korean Patent Application No. 10-2006-71251 filed on Jul. 28, 2006, the contents of which are herein incorporated by reference in its entirety for all purpose.

BACKGROUND OF THE INVENTION

1. Field of the Invention

The present invention relates to a multi-tone optical mask, a method of manufacturing the multi-tone optical mask and a method of manufacturing a thin-film transistor (TFT) substrate by using the multi-tone optical mask. More particularly, the present invention relates to a multi-tone optical mask capable of improving a manufacturing efficiency of a TFT substrate, a method of manufacturing the multi-tone optical mask and a method of manufacturing a TFT substrate by using the multi-tone optical mask.

2. Description of the Related Art

In general, a liquid crystal display (LCD) apparatus includes a flat display substrate. The display substrate includes a plurality of switching devices and a plurality of signal lines. The switching devices control a plurality of pixels, and the signal lines provide the switching devices with electrical signals.

The LCD apparatus includes a thin-film transistor (TFT) substrate having a plurality of TFTs, a color filter substrate having a color filter and a liquid crystal layer interposed between the TFT substrate and the color filter substrate. The LCD apparatus controls the liquid crystal layer by using signals applied to the TFTs to display an image.

The TFT substrate is manufactured through a plurality of layer-deposition processes and a plurality of photolithography processes. A manufacturing cost of the TFT substrate depends on the number of the photolithography processes.

In order to reduce the number of optical masks required for the photolithography processes, a photoresist pattern capable of etching a plurality of layers may be formed using one optical mask. Alternatively, a multi-step pattern having a plurality of steps may be formed by using one optical mask.

For the above, a method of exposing a positive photoresist layer to light by using a slit optical mask having a slit portion corresponding to a selected area of a substrate to form a photoresist pattern having a different thickness has been developed. Furthermore, a half-tone optical mask, of which a slit portion is substituted for a material having a proper light-transmittance to improve uniformity of a slit portion, has been developed.

However, when the slit optical mask is used, a residual photoresist layer corresponding to the slit portion is non-uniform. Furthermore, a photoresist pattern having a relatively great width may not be formed using the slit optical mask. The half-tone optical mask has three light-transmittances corresponding a transmitting area, a half-tone area and a non-transmitting area. Thus, a photoresist pattern formed using the half-tone optical mask may not have various thicknesses. Particularly, a line pattern formed under the photoresist pattern is non-uniform depending on disposition of the line pattern, disposition density of the line patterns, and the shape of the line pattern.

SUMMARY OF THE INVENTION

The present invention provides a multi-tone optical mask capable of improving a manufacturing efficiency of a TFT substrate The present invention also provides a method of manufacturing the above-mentioned multi-tone optical mask.

The present invention also provides a method of manufacturing a TFT substrate by using the above-mentioned multi-tone optical mask.

In one aspect of the present invention, a multi-tone optical mask includes a substrate, a light-blocking pattern, a first semi-transmitting pattern and a second semi-transmitting pattern. The light-blocking pattern is formed on the substrate. The first semi-transmitting pattern is formed on the substrate and has a light-transmittance of a first value. The second semi-transmitting pattern has a light-transmittance of a second different value. The second semi-transmitting pattern includes a first portion overlapping the first semi-transmitting pattern and a second portion formed on the substrate. For example, the multi-tone optical mask may further include a third semi-transmitting pattern partially overlapping the second semi-transmitting pattern so that the multi-tone optical mask has at least six different light-transmittances corresponding to a plurality of areas divided on the substrate.

The multi-tone optical mask may further include a protecting layer covering the light-blocking pattern, the first semi-transmitting pattern and the second semi-transmitting pattern.

At least a portion of the first semi-transmitting pattern may be disposed on the light-blocking pattern, and a portion of the second semi-transmitting pattern may be disposed on the first semi-transmitting pattern.

The multi-tone optical mask may further include at least one etch-stopping layer formed between the light-blocking pattern and the first semi-transmitting pattern, between the first semi-transmitting pattern and the second semi-transmitting pattern and/or between the second semi-transmitting pattern and the third semi-transmitting pattern. A composition of the light-blocking pattern may include chromium, and a composition of each of the first, second and third semi-transmitting patterns may include at least one selected from the group consisting of chromium oxide, chromium nitride, chromium oxide nitride and molybdenum silicide.

For example, a composition of the first semi-transmitting pattern may include molybdenum silicide, and a composition of the second semi-transmitting pattern may include at least one material selected from the group consisting of chromium oxide, chromium nitride and chromium oxide nitride.

When the multi-tone optical mask includes a third semi-transmitting pattern, the third semi-transmitting pattern may be formed on an etch-stopping layer covering the light-blocking pattern, the first semi-transmitting pattern and the second semi-transmitting pattern. A composition of the third semi-transmitting pattern may include at least one material selected from the group consisting of chromium oxide, chromium nitride and chromium oxide nitride.

The light-blocking pattern may be covered by the first semi-transmitting pattern. Alternatively, at least a portion of the light-blocking pattern may be disposed on the first semi-transmitting pattern and/or the second semi-transmitting pattern.

In another aspect of the present invention, there is provided a method of manufacturing a multi-tone optical mask. In the method, the light-blocking pattern is formed on the substrate. The first semi-transmitting pattern is formed on the substrate. The second semi-transmitting pattern is formed to be partially overlapped with the first semi-transmitting pattern. The second semi-transmitting pattern includes a first portion overlapping the first semi-transmitting pattern and a second portion formed on the substrate.

In still another aspect of the present invention, there is provided a method of manufacturing a thin-film transistor substrate. In the method, an etched pattern is formed using a multi-step photoresist pattern in a display area for a first TFT and in a peripheral area for a second TFT switching the first TFT on a substrate. A multi-step photoresist pattern is formed using a multi-tone optical mask. The multi-tone optical mask includes a substrate, a light-blocking pattern, a first semi-transmitting pattern and a second semi-transmitting pattern. The light-blocking pattern is formed on the substrate. The first semi-transmitting pattern is formed on the substrate. The second semi-transmitting pattern partially overlaps the first semi-transmitting pattern. The multi-tone optical mask has at least five different light-transmittances corresponding to a plurality of areas divided on the substrate. The etched pattern is formed using the multi-step photoresist pattern as an etching block.

According to the above, a thin-film pattern having a multi-step may be formed using one mask so that a manufacturing efficiency is improved. Furthermore, a photoresist layer is exposed to light by using a multi-tone optical mask having a plurality of tones properly corresponding to a plurality of areas of the substrate so that a uniform step may be formed. Thus, a manufacturing yield of a TFT substrate may be increased.

BRIEF DESCRIPTION OF THE DRAWINGS

The above and other advantages of the present invention will become readily apparent by reference to the following detailed description when considered in conjunction with the accompanying drawings wherein:

FIGS. 4A, 4B, 4C, 4D, 4E and 4F are cross-sectional views illustrating a method of manufacturing a multi-tone optical mask according to an exemplary embodiment of the present invention;

DESCRIPTION OF THE EMBODIMENTS

Figure 1:
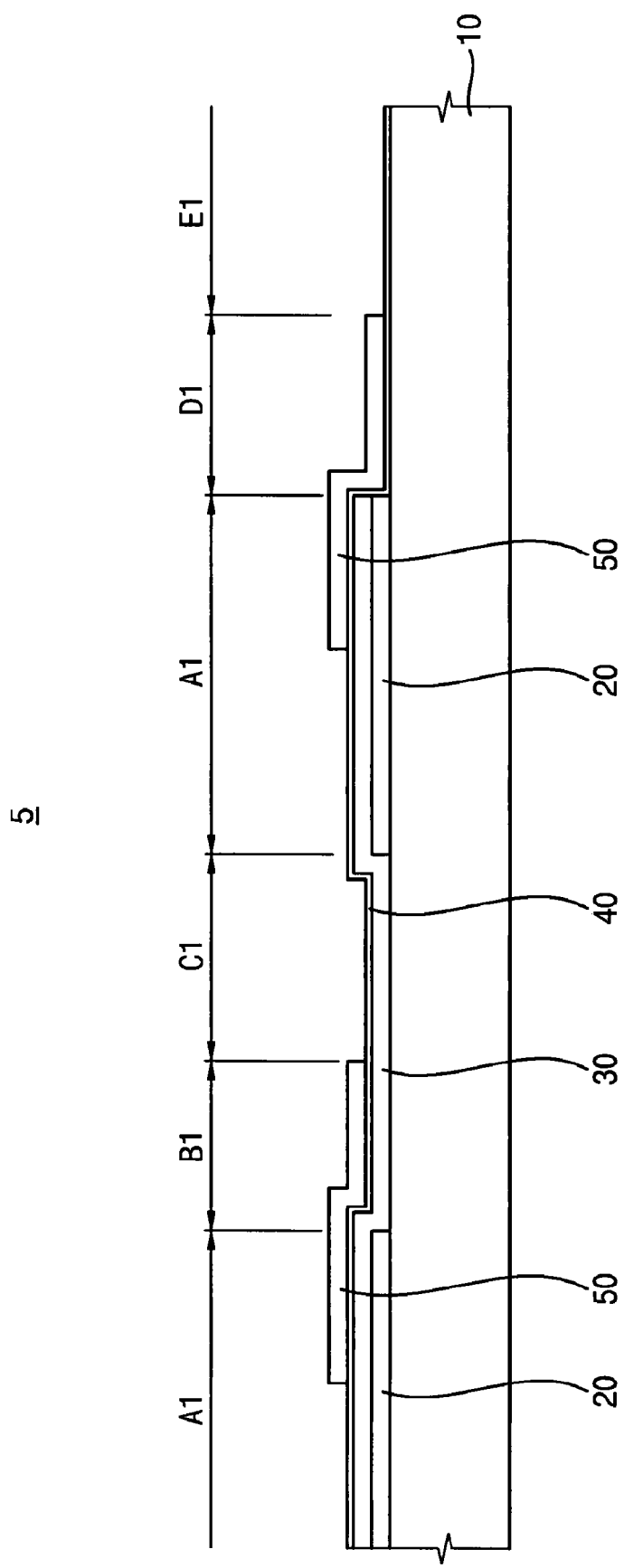
FIG. 1 is a cross-sectional view illustrating a multi-tone optical mask according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to nonimplanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Multi-Tone Optical Mask

FIG. 1 is a cross-sectional view illustrating a multi-tone optical mask according to an exemplary embodiment of the present invention.

A multi-tone optical mask 5 may be used for forming a photoresist pattern to form a circuit pattern on a substrate and/or for patterning an organic layer. Referring to FIG. 1, the multi-tone optical mask 5 includes a substrate 10, a light-blocking pattern 20, a first semi-transmitting pattern 30 and a second semi-transmitting pattern 50.

The substrate 10 may include, for example, glass for an optical mask, of which the light-transmittance is near 100%, such as quartz. The light-blocking pattern 20 is formed on a portion of the substrate 10. The light-blocking pattern 20 may include, for example, metal, of which the light-transmittance is near 0%. For example, a chromium (Cr) layer formed on the substrate 10 may be etched to form the light-blocking pattern 20.

The first semi-transmitting pattern 30 partially overlaps the light-blocking pattern 20. Thus, a portion of the first semi-transmitting pattern 30 is formed on the light-blocking pattern 20, and a remaining portion of the first semi-transmitting pattern 30 is formed on a surface of the substrate 10. Alternatively, the first semi-transmitting pattern 30 may not overlap the light-blocking pattern 20.

The second semi-transmitting pattern 50 is overlapped with a portion of the first semi-transmitting pattern 30. Furthermore, the second semi-transmitting pattern 50 may partially overlap the light-blocking pattern 20. A remaining portion of the second semi-transmitting pattern 50 may make contact with etch-stopping layer 40 which is formed on the surface of the substrate 10 or directly contact the surface of the substrate 10

Examples of a material that may be used for the first and second semi-transmitting patterns 30 and 50 may include chromium oxide (CrOx), chromium nitride (CrNx), chromium oxide nitride (CrOxNy) and molybdenum silicide (MoSi).

When the first and second semi-transmitting patterns 30 and 50 include chromium-containing material, a chromium-containing layer, for example, a chromium oxide layer, a chromium nitride layer, or a chromium oxide nitride layer, may be wet-etched to form the first and second semi-transmitting patterns 30 and 50. When the second semi-transmitting pattern 50 is etched, the first semi-transmitting pattern 30 may be damaged.

Thus, the multi-tone optical mask 5 may further include an etch-stopping layer 40. The etch-stopping layer 40 is formed on an entire region of the substrate 10 having the first semi-transmitting pattern 30 to protect the first semi-transmitting pattern 30 during a process of forming the second semi-transmitting pattern 50. Furthermore, an auxiliary etch-stopping layer may be formed between the light-blocking pattern 20 and the first semi-transmitting pattern 30. The light-transmittance of the etch-stopping layer may be near 100%.

A molybdenum silicide layer may be patterned through a dry etching process. A selective etching ratio of molybdenum silicide with respect to the chromium-containing material is relatively great. Thus, when one of the first and second semi-transmitting patterns 30 and 50 is formed from the molybdenum silicide layer, and when the remaining one is formed from the chromium-containing layer, the etch-stopping layer 40 may be omitted.

The multi-tone optical mask 5 may further include a protecting layer (not shown), of which the light transmittance is near 100%. The protecting layer covers the substrate 10 having the second semi-transmitting pattern 50 to protect the light-blocking pattern 20, the first semi-transmitting pattern 30 and the second semi-transmitting pattern 50.

In this embodiment, the light-blocking pattern 20 is covered by the first semi-transmitting pattern 30. However, at least a portion of the light-blocking pattern 20 may be formed on the first semi-transmitting pattern 30 and/or the second semi-transmitting pattern 50.

The multi-tone optical mask 5 has, as illustrated in FIG. 1, a first area A1 having a first light-transmittance, a second area B1 having a second light-transmittance, a third area C1 having a third light-transmittance, a fourth area D1 having a fourth light-transmittance and a fifth area E1 having a fifth light-transmittance. The first area A1 corresponds to the light-blocking pattern 20. The second area B1 corresponds to a portion of the first semi-transmitting pattern 30, which is overlapped with the second semi-transmitting pattern 50. The third area C1 corresponds to a remaining portion of the first semi-transmitting pattern 30 except for the first and second areas A1 and B1. The fourth area D1 corresponds to a remaining portion of the second semi-transmitting pattern 50 except for the first and second areas A1 and B1. The fifth area E1 corresponds to a remaining portion of the substrate 10 except for the first, second, third and fourth areas A1, B1, C1 and D1.

The light-transmittance of the multi-tone optical mask 5 depends on materials and thicknesses, of the first and second semi-transmitting patterns 30 and 50. The light-transmittance of each of the first, second, third, fourth and fifth areas A1, B1, C1, D1 and E1 may be a value of multiplying the light-transmittances of the patterns disposed in each of the first, second, third, fourth and fifth areas A1, B1, C1, D1 and E1. Thus, when the light-transmittance of the first semi-transmitting pattern 30 is about x %, and when the light-transmittance of the second semi-transmitting pattern 50 is about y %, the first light-transmittance of the first area A1 is about 0%. Furthermore, the second light-transmittance of the second area B1 is about xy %, the third light-transmittance of the third area C1 is about x %, the fourth light-transmittance of the fourth area D1 is about y % and the fifth light-transmittance of the fifth area E1 is about 100%.

For example, when the light-transmittance of the first semi-transmitting pattern 30 is about 50%, and when the light-transmittance of the second semi-transmitting pattern 50 is about 80%, the second light-transmittance of the second area B1 is about 40%, and the third light-transmittance of the third area C1 is about 50%, and the fourth light-transmittance of the fourth area D1 is about 80%.

Thus, when a thin-film pattern having a plurality of steps is formed on a substrate by using the multi-tone optical mask 5, the light-blocking pattern 20, the first semi-transmitting pattern 30 and the second semi-transmitting pattern 50 may be designed such that the first, second, third, fourth and fifth areas A1, B1, C1, D1 and E1 properly corresponds to the steps.

Figure 2:
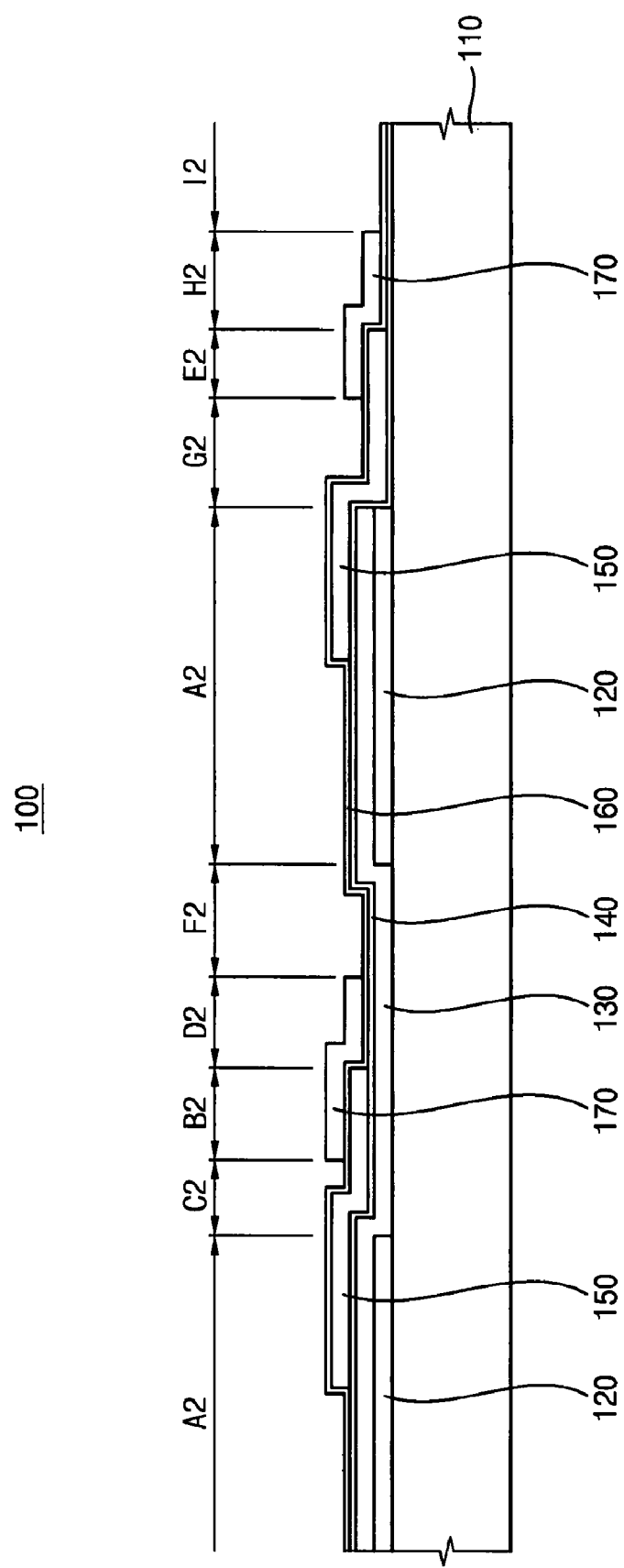
FIG. 2 is a cross-sectional view illustrating a multi-tone optical mask according to another exemplary embodiment of the present invention.

FIG. 2 is a cross-sectional view illustrating a multi-tone optical mask according to another exemplary embodiment of the present invention.

Referring to FIG. 2, a multi-tone optical mask 100 includes a substrate 110, a light-blocking pattern 120, a first semi-transmitting pattern 130, a first etch-stopping layer 140, a second semi-transmitting pattern 150, a second etch-stopping layer 160 and a third semi-transmitting pattern 170. The multi-tone optical mask 100 is substantially the same as the multi-tone optical mask 5 illustrated in FIG. 1 except for further including the second etch-stopping layer 160 and the third semi-transmitting pattern 170.

Thus, the first semi-transmitting pattern 130 partially overlaps the light-blocking pattern 120, and the second semi-transmitting pattern 150 partially overlaps the first semi-transmitting pattern 130. The first etch-stopping layer 140 is disposed between the first and second semi-transmitting patterns 130 and 150.

The second etch-stopping layer 160 covers the substrate 110 having the second semi-transmitting pattern 150. The third semi-transmitting pattern 170 is formed on the second etch-stopping layer 160 and partially overlaps the second semi-transmitting pattern 150. Examples of a material that may be used for the third semi-transmitting pattern 170 may include chromium oxide, chromium nitride, chromium oxide nitride, and molybdenum silicide.

A selective etching ratio of molybdenum silicide with respect to the chromium-containing material is relatively great. Thus, at least one of the first, second semi-transmitting patterns 130 and 150 may be formed from the molybdenum silicide layer, and remaining semi-transmitting patterns may be formed from the chromium-containing layer, the etch-stopping layer may be omitted.

For example, when the first semi-transmitting pattern 130 is formed from the molybdenum silicide layer, and the second semi-transmitting pattern 150 is formed from the chromium-containing layer, the first etch-stopping layer 140 may be omitted.

Alternatively, when the second semi-transmitting pattern 150 is formed from the molybdenum silicide layer, and the third semi-transmitting pattern 170 is formed from the chromium-containing layer, the second etch-stopping layer 160 may be omitted.

In this embodiment, the light-blocking pattern 120 is covered by the first semi-transmitting pattern 130. However, at least a portion of the light-blocking pattern 120 may be formed on at least one of the first, second and third semi-transmitting patterns 130, 150 and 170.

The multi-tone optical mask 100 has, as illustrated in FIG. 2, a first area A2 having a first light-transmittance, a second area B2 having a second light-transmittance, a third area C2 having a third light-transmittance, a fourth area D2 having a fourth light-transmittance, a fifth area E2 having a fifth light-transmittance, a sixth area F2 having a sixth light-transmittance, a seventh area G2 having a seventh light-transmittance, an eighth area H2 having an eighth light-transmittance and a ninth area I2 having a ninth light-transmittance.

The first area A2 corresponds to the light-blocking pattern 120. The second area B2 corresponds to a portion of the first semi-transmitting pattern 130, which overlaps the second semi-transmitting pattern 150 and the third semi-transmitting pattern 170. The third area C2 corresponds to a portion of the first semi-transmitting pattern 130, which overlaps the second semi-transmitting pattern 150. The fourth area D2 corresponds to a portion of the first semi-transmitting pattern 130, which overlaps the third semi-transmitting pattern 170. The fifth area E2 corresponds to a portion of the second semi-transmitting pattern 150, which overlaps the third semi-transmitting pattern 170. The sixth area F2 corresponds to a remaining portion of the first semi-transmitting pattern 130 except for the first, second, third and fourth areas A2, B2, C2 and D2. The seventh area G2 corresponds to a remaining portion of the second semi-transmitting pattern 150 except for the first, second, third and fifth areas A2, B2, C2 and E2. The eighth area H2 corresponds to a remaining portion of the third semi-transmitting pattern 170 except for the first, second, fourth and fifth areas A2, B2, D2 and E2. The ninth area I2 corresponds to a remaining portion of the substrate 110 without overlapping the first light-blocking pattern 120, the first semi-transmitting pattern 130, the second semi-transmitting pattern 150 and the third semi-transmitting pattern 170.

Figure 3:
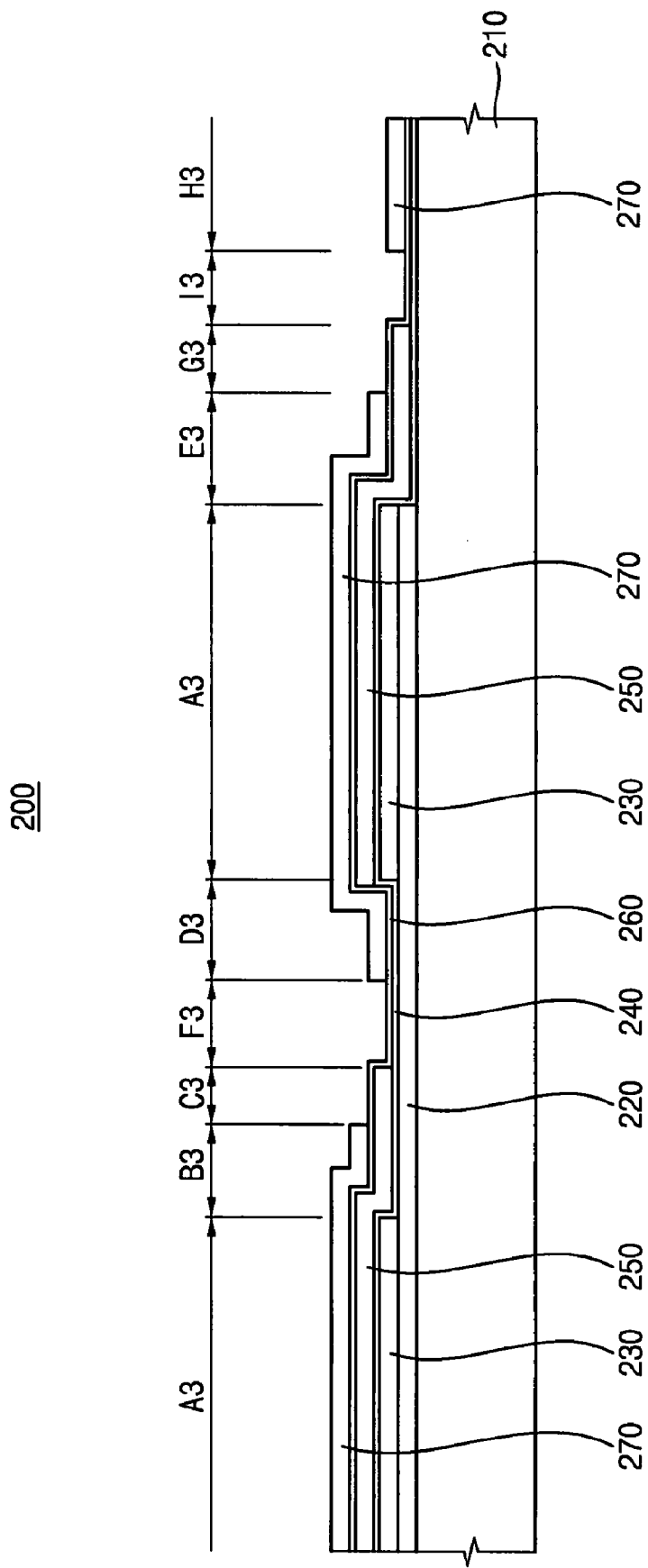
FIG. 3 is a cross-sectional view illustrating a multi-tone optical mask according to still another exemplary embodiment of the present invention.

FIG. 3 is a cross-sectional view illustrating a multi-tone optical mask according to still another exemplary embodiment of the present invention.

Referring to FIG. 3, a multi-tone optical mask 200 includes a substrate 210, a first semi-transmitting pattern 220, a light-blocking pattern 230, a second semi-transmitting pattern 250 and a third semi-transmitting pattern 200.

The multi-tone optical mask 200 is substantially the same as the multi-tone optical mask 100 illustrated in FIG. 2, except that the light-blocking pattern 230 is formed between the first and second semi-transmitting patterns 220 and 250.

The first semi-transmitting pattern 220 is formed on a portion of the substrate 210.

The light-blocking pattern 230 is partially overlapped with the first semi-transmitting pattern 220, and a remaining portion of the light-blocking pattern 230 makes contact with the substrate 210. The second semi-transmitting pattern 250 is partially overlapped with the light-blocking pattern 230 and the first semi-transmitting pattern 220. The third semi-transmitting pattern 270 is partially overlapped with the second semi-transmitting pattern 250.

Examples of a material that may be used for the first, second and third semi-transmitting patterns 220, 250 and 270 may include chromium oxide, chromium nitride, chromium oxide nitride, and molybdenum silicide.

For example, the first semi-transmitting pattern 220 may include molybdenum silicide. When the second and/or third semi-transmitting pattern 250 and/or 270 includes chromium-containing material, the multi-tone optical mask 200 may further include a first etch-stopping layer 240 and a second etch-stopping layer 260. The first etch-stopping layer 240 is formed between the light-blocking pattern 230 and the second semi-transmitting pattern 250, and the second etch-stopping layer 240 is formed between the second and third semi-transmitting patterns 250 and 270.

The multi-tone optical mask 200 has, as illustrated in FIG. 3, a first area A3 having a first light-transmittance, a second area B3 having a second light-transmittance, a third area C3 having a third light-transmittance, a fourth area D3 having a fourth light-transmittance, a fifth area E3 having a fifth light-transmittance, a sixth area F3 having a sixth light-transmittance, a seventh area G3 having a seventh light-transmittance, an eighth area H3 having an eighth light-transmittance and a ninth area I3 having a ninth light-transmittance. Each of the first, second, third, fourth, fifth, sixth, seventh, eighth and ninth areas A3, B3, C3, D3, E3, F3, G3, H3 and I3 is defined as substantially the same as each of the first, second, third, fourth, fifth, sixth, seventh, eighth and ninth areas A2, B2, C2, D2, E2, F2, G2, H2 and I2 illustrated in FIG. 2.

Method of Manufacturing a Multi-Tone Optical Mask

FIGS. 4A, 4B, 4C, 4D, 4E and 4F are cross-sectional views illustrating a method of manufacturing a multi-tone optical mask according to an exemplary embodiment of the present invention.

Referring to FIG. 4A to 4D, a light-blocking pattern 320 is formed on a substrate 310. A first semi-transmitting pattern 330 is formed to partially overlap the light-blocking pattern 320. A second semi-transmitting pattern 350 is formed to partially overlap the first semi-transmitting pattern 330. A multi-tone optical mask may be divided into a plurality of areas to have at least a first light-transmittance, a second light-transmittance, a third light-transmittance, a fourth light-transmittance and a fifth light-transmittance, which correspond to the areas.

Figure 4A:
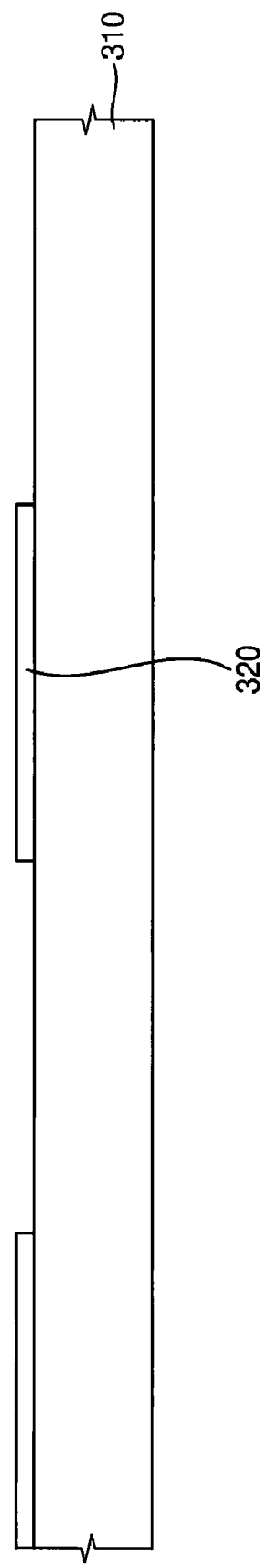

Referring to FIG. 4A, a light-blocking layer is deposited on the substrate 310 through, for example, a sputtering process, and then etched through a photolithography process to form the light-blocking pattern 320. When the light-blocking pattern 320 includes chromium, a chromium layer is patterned through a wet-etching process to form the light-blocking pattern 320.

Referring to FIG. 4B, a semi-transmitting layer including, for example, chromium oxide, chromium nitride, chromium oxide nitride or molybdenum silicide, is deposited on the substrate 310 having the light-blocking pattern 320 through a sputtering process, and then etched through a photolithography process to form the first semi-transmitting pattern 330 partially overlapping the light-blocking pattern 320. Alternatively, the first semi-transmitting pattern 330 may not overlap the light-blocking pattern 320.

A chromium oxide layer, a chromium nitride layer and a chromium oxide nitride layer may be patterned through a wet-etchihg process, and a molybdenum silicide layer may be patterned through a dry-etching process. When the first semi-transmitting pattern 330 is formed from the chromium-containing layer, an etch-stopping layer may be further formed between the light-blocking pattern 320 and the first semi-transmitting pattern 330.

Figure 4C:
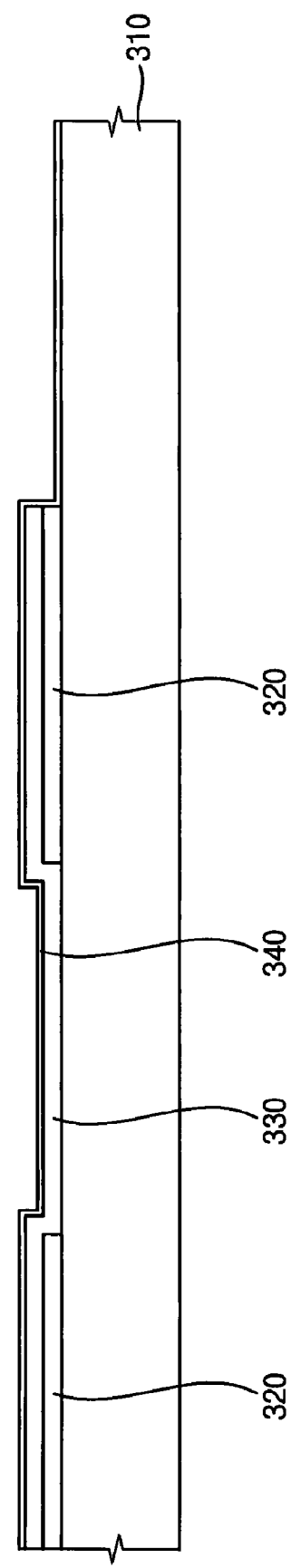

Referring to FIG. 4C, a first etch-stopping layer 340 is formed on the substrate 310 having the first semi-transmitting pattern 330. A material that may be used for the first etch-stopping layer 340 may be varied depending on the first semi-transmitting pattern 330, the second semi-transmitting pattern 350, and an etchant. When a selective etching ratio of the chromium-containing layer with respect to the light-blocking pattern 320 may be relatively great, the etch-stopping layer 340 may be omitted. A selective etching ratio of the molybdenum silicide layer with respect to the chromium layer is relatively great. Thus, when the first semi-transmitting pattern 330 is formed from the molybdenum silicide layer, the etch-stopping layer may be omitted.

Figure 4D:
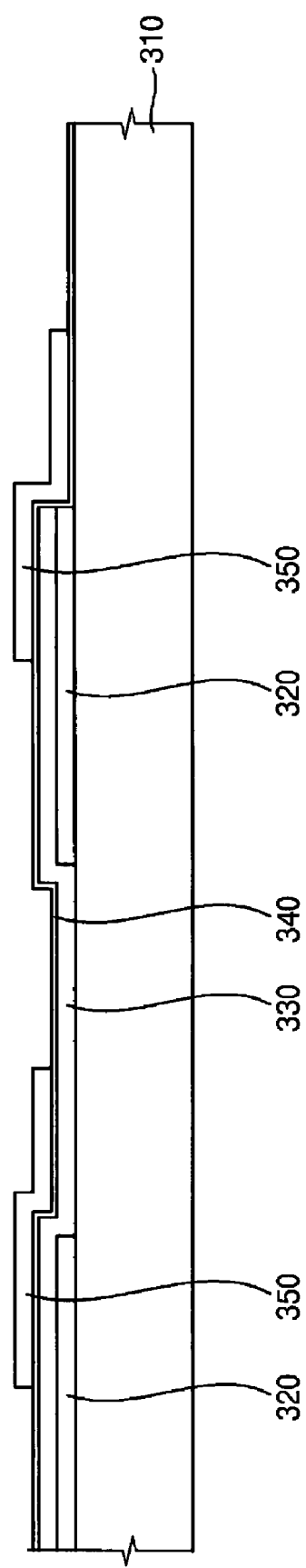

Referring to FIG. 4D, a semi-transmitting layer, for example, a chromium oxide layer, a chromium nitride layer, a chromium oxide nitride layer or a molybdenum silicide layer, is formed on the first etch-stopping layer 340, and then patterned through a photolithography process to form the second semi-transmitting pattern 350 partially overlapping the first semi-transmitting pattern 330.

In this embodiment, the light-blocking pattern 320 is covered by the first semi-transmitting pattern 330. However, at least a portion of the light-blocking pattern 320 may be disposed on the first semi-transmitting pattern 330 and/or the second semi-transmitting pattern 350.

For example, the first semi-transmitting pattern 330, the light-blocking pattern 320 and the second semi-transmitting pattern 350 are sequentially formed on the substrate 310. Alternatively, the first semi-transmitting pattern 330, the second semi-transmitting pattern 350 and the light-blocking pattern 320 may be sequentially formed on the substrate 310.

An order of forming the light-blocking pattern 320, the first semi-transmitting pattern 330 and the second semi-transmitting pattern 350 may be varied. For example, the light-blocking pattern 320 may be formed after the first semi-transmitting pattern 330.

Alternatively, after the first semi-transmitting layer is deposited on the substrate 310, a light-blocking layer is deposited on the first semi-transmitting layer. Thereafter, the light-blocking layer is etched to form the light-blocking pattern, and the first semi-transmitting layer is etched to form the first semi-transmitting pattern. Thereafter, a second semi-transmitting layer is deposited on the light-blocking pattern and the first semi-transmitting pattern. The second semi-transmitting layer is etched to form the second semi-transmitting pattern.

Figure 4E:
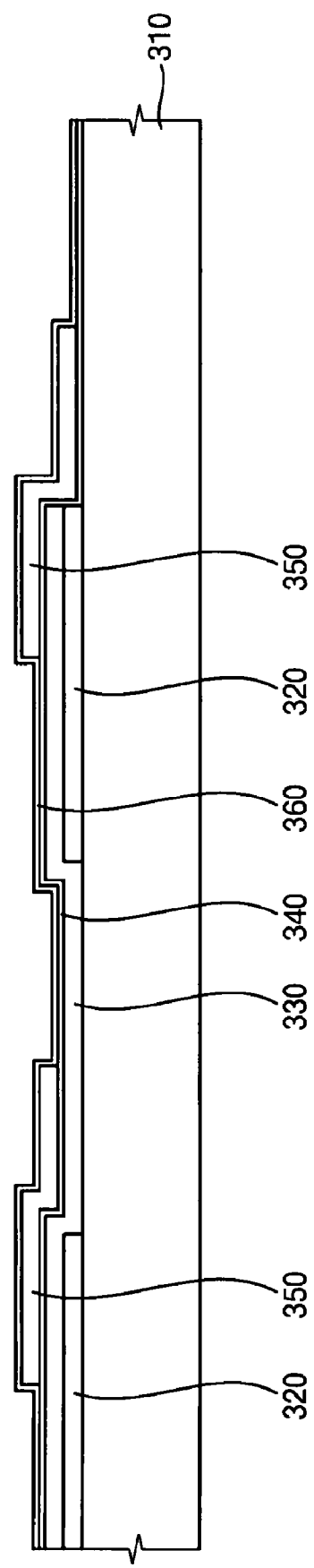
Figure 4F:
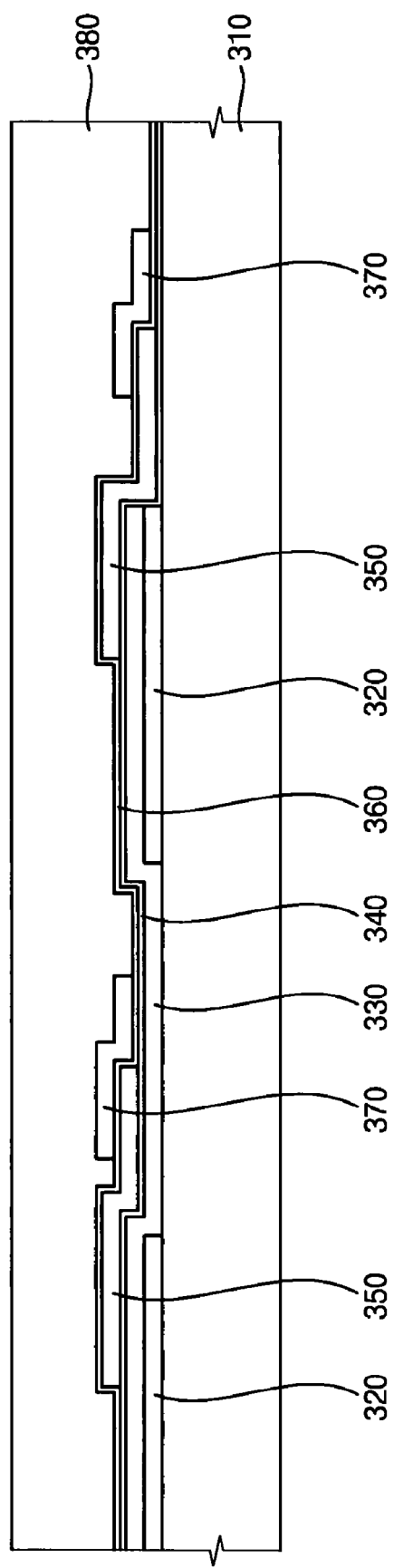

FIGS. 4E and 4F are cross-sectional views illustrating processes of forming a third semi-transmitting pattern 370.

Referring to FIGS. 4E and 4F, the third semi-transmitting pattern 370 partially overlapping the second semi-transmitting pattern 350 may be further formed.

Particularly, a second etch-stopping layer 360 is formed on the second semi-transmitting pattern 350, as illustrated in FIG. 4E. A semi-transmitting layer, for example, a chromium oxide layer, a chromium nitride layer, a chromium oxide nitride layer or a molybdenum silicide layer, is formed on the second etch-stopping layer 360, and then patterned through a photolithography process to form the third semi-transmitting pattern 370 partially overlapping the second semi-transmitting pattern 350.

A selective etching ratio of molybdenum silicide with respect to the chromium-containing material is relatively great. For example, when the first semi-transmitting pattern 330 is formed from the molybdenum silicide layer, and the second semi-transmitting pattern 350 is formed from the chromium-containing layer, the first etch-stopping layer 340 may be omitted.

Alternatively, when the second semi-transmitting pattern 350 is formed from the molybdenum silicide layer, and the third semi-transmitting pattern 370 is formed from the chromium-containing layer, the second etch-stopping layer 360 may be omitted.

Furthermore, when the first and third semi-transmitting patterns 330 and 370 are formed from the chromium-containing layer, and the second semi-transmitting pattern is formed from the molybdenum silicide layer, or when the first and third semi-transmitting patterns 330 and 370 are formed from the molybdenum silicide layer, and the second semi-transmitting pattern is formed from the chromium-containing layer, the first and second etch-stopping layers 340 and 360 may be omitted.

Furthermore, when the first, second and third semi-transmitting patterns 330, 350 and 370 are respectively formed from chromium-containing layers having a relatively great selective etching ratio with respect to each other, the first and second etch-stopping layers 340 and 360 may be omitted.

Furthermore, a protecting layer 380 may be further formed on the substrate 310 having the third semi-transmitting pattern 370.

As illustrated in FIG. 2, a multi-tone optical mask manufactured through the above-mentioned processes may have nine areas having nine light-transmittances different from each other. However, the number of the areas and the light-transmittances may be reduced depending on a method of overlapping the first, second and third semi-transmitting patterns 330, 350 and 370 with each other.

Alternatively, the light-blocking pattern 320 may be formed according to a different order. For example, as illustrated in FIG. 3, the light-blocking pattern 320 may be formed on the substrate 310 having the first semi-transmitting pattern 330 or on the substrate 310 having the third semi-transmitting pattern 370.

In this exemplary embodiment, the light-blocking pattern 320, the first semi-transmitting pattern 330, the second semi-transmitting pattern 350 and the third semi-transmitting pattern 370 are sequentially formed on the substrate 310. Thus, the first semi-transmitting pattern 330 may be between the light-blocking pattern 320 and the second semi-transmitting pattern 350 or not. Furthermore, the second semi-transmitting pattern 350 may be between the first and third semi-transmitting patterns 330 and 370 or not.

Alternatively, an order of etching the light-blocking pattern 320, the first semi-transmitting pattern 330, the second semi-transmitting pattern 350 and the third semi-transmitting pattern 370 may be changed. For example, a light-blocking layer, a first semi-transmitting layer, a second semi-transmitting layer and a third semi-transmitting layer may be sequentially deposited and then patterned starting from the third semi-transmitting layer to sequentially form the third semi-transmitting pattern 370, the second semi-transmitting pattern 350, the first semi-transmitting pattern 330 and the light-blocking pattern 320.

When the third semi-transmitting pattern 370, the second semi-transmitting pattern 350, the first semi-transmitting pattern 330 and the light-blocking pattern 320 are sequentially formed, the third semi-transmitting pattern 370 is necessarily formed with the second semi-transmitting pattern 350 under the third semi-transmitting pattern 370. Furthermore, the second semi-transmitting pattern 350 is necessarily formed with the first semi-transmitting pattern 330 under the second semi-transmitting pattern 350, and the first semi-transmitting pattern 330 is necessarily formed with the light-blocking pattern 320 under the first semi-transmitting pattern 330. Thus, a multi-tone optical mask may be at most five light-transmittances different from each other.

Method of Manufacturing a Thin-Film Transistor Substrate

Figure 5:
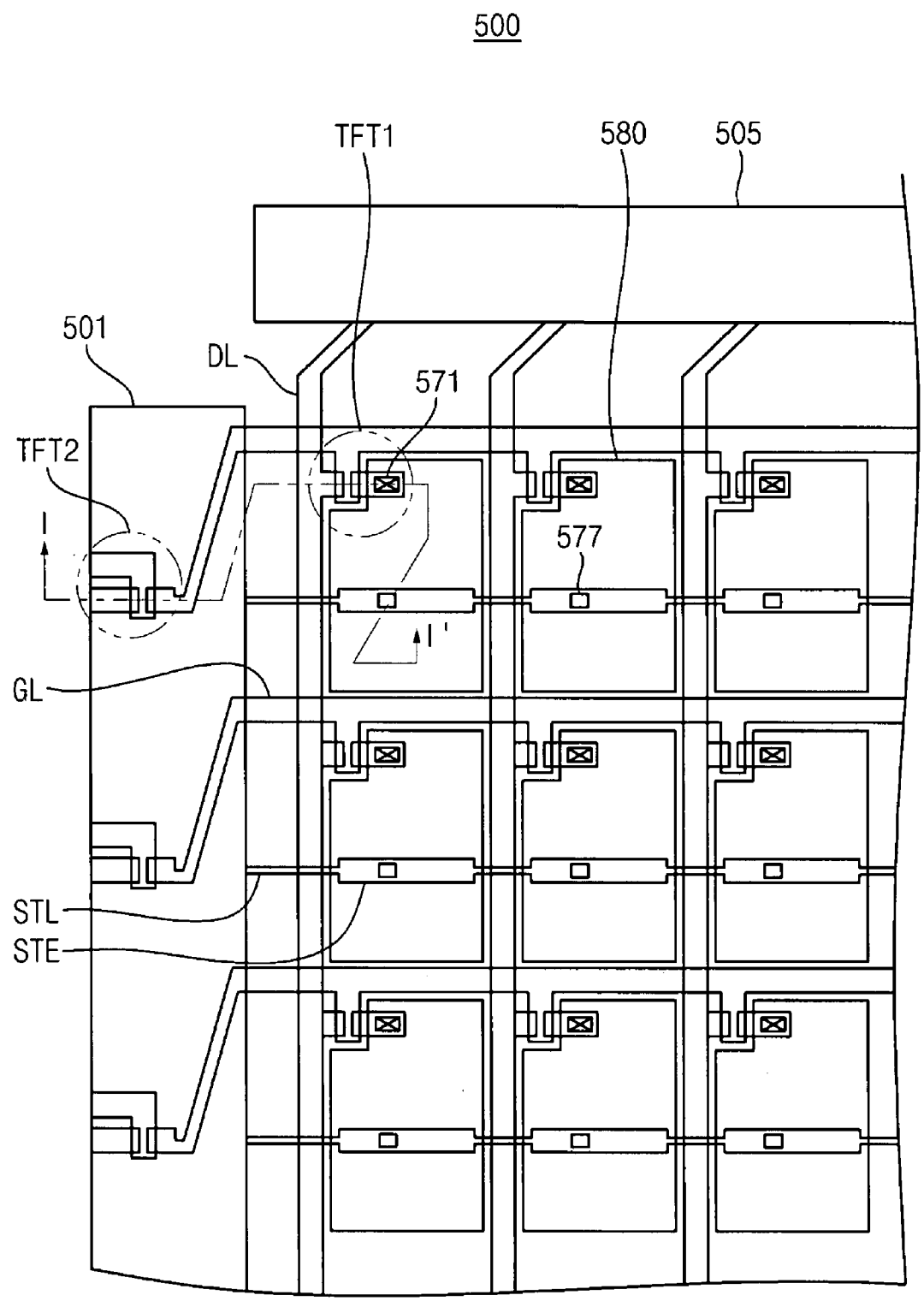
FIG. 5 is a plan view illustrating a thin-film transistor substrate manufactured by a method of manufacturing a thin-film transistor substrate according to an exemplary embodiment of the present invention.
Figure 6:
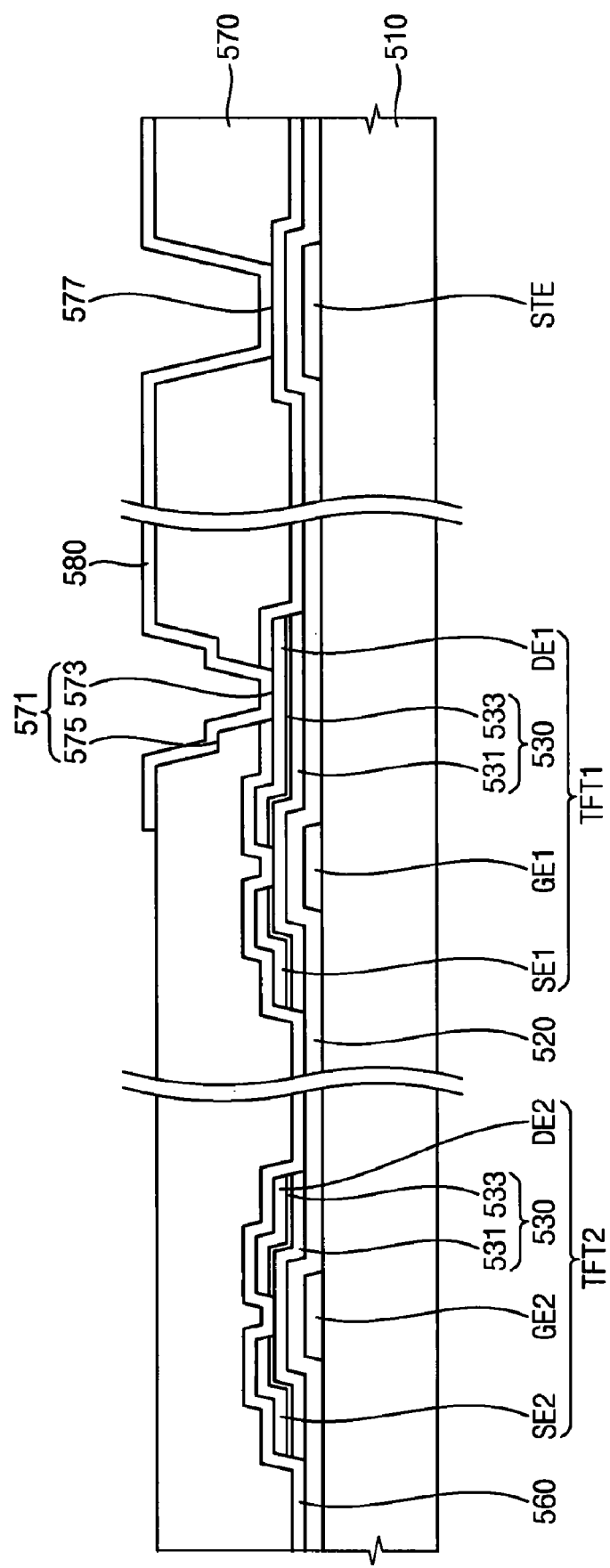
FIG. 6 is a cross-sectional view taken along a line I-I' of FIG. 5.

FIG. 5 is a plan view illustrating a thin-film transistor substrate manufactured by a method of manufacturing a thin-film transistor substrate according to an exemplary embodiment of the present invention. FIG. 6 is a cross-sectional view taken along a line I-I' of FIG. 5.

Referring to FIG. 5, a thin-film transistor substrate 500 includes a display area and a peripheral area. A plurality of pixels is arranged in the display area in a matrix configuration. A data driver 505 and a gate driver 501 are disposed in the peripheral area to drive the pixels. The data driver 505 may include a data-driving integrated chip. The gate driver 501 may include a gate-driving integrated chip. Alternatively, the gate driver 501 may be integrated on a substrate. In this exemplary embodiment, the gate driver 501 is integrated on the substrate.

Referring to FIGS. 5 and 6, each of the pixels includes a first thin-film transistor TFT1 and a pixel electrode 580. The first thin-film transistor TFT1 includes a first gate electrode GE1, an active layer 530, a first source electrode SE1 and a first drain electrode DE1. The pixel electrode 580 is electrically connected to the first drain electrode DE1.

The data driver 505 provides a plurality of data lines DL with a pixel voltage in response to an image data. The gate driver 501 provides a plurality of gate lines GL with a gate signal in response to a control signal. The gate driver 501 may further include a second thin-film transistor TFT2 switching the control signal and the gate signal.

The second thin-film transistor TFT2 may include a second gate electrode GE2, an active layer 530, a second source electrode SE2 and a second drain electrode DE2. The data lines DL cross the gate lines GL. Each of the pixels is defined by the data lines DL adjacent to each other and the gate lines GL adjacent to each other.

The thin-film transistor substrate 500 may further include a plurality of storage lines STL disposed between the gate lines GL. Furthermore, the thin-film transistor substrate 400 may further include an organic insulation pattern 570 covering the first thin-film transistor TFT1 and the second thin-film transistor TFT2. A first contact hole 571 exposing a portion of the first drain electrode DE1 and a second contact hole 577 exposing a portion of a storage electrode of the storage line STL are formed through the organic insulation pattern 570. A method of manufacturing the thin-film transistor substrate 500 is described more fully hereinafter.

FIGS. 7 through 12 are cross-sectional views illustrating a method of manufacturing the thin-film transistor substrate illustrated in FIG. 5.

Figure 7:
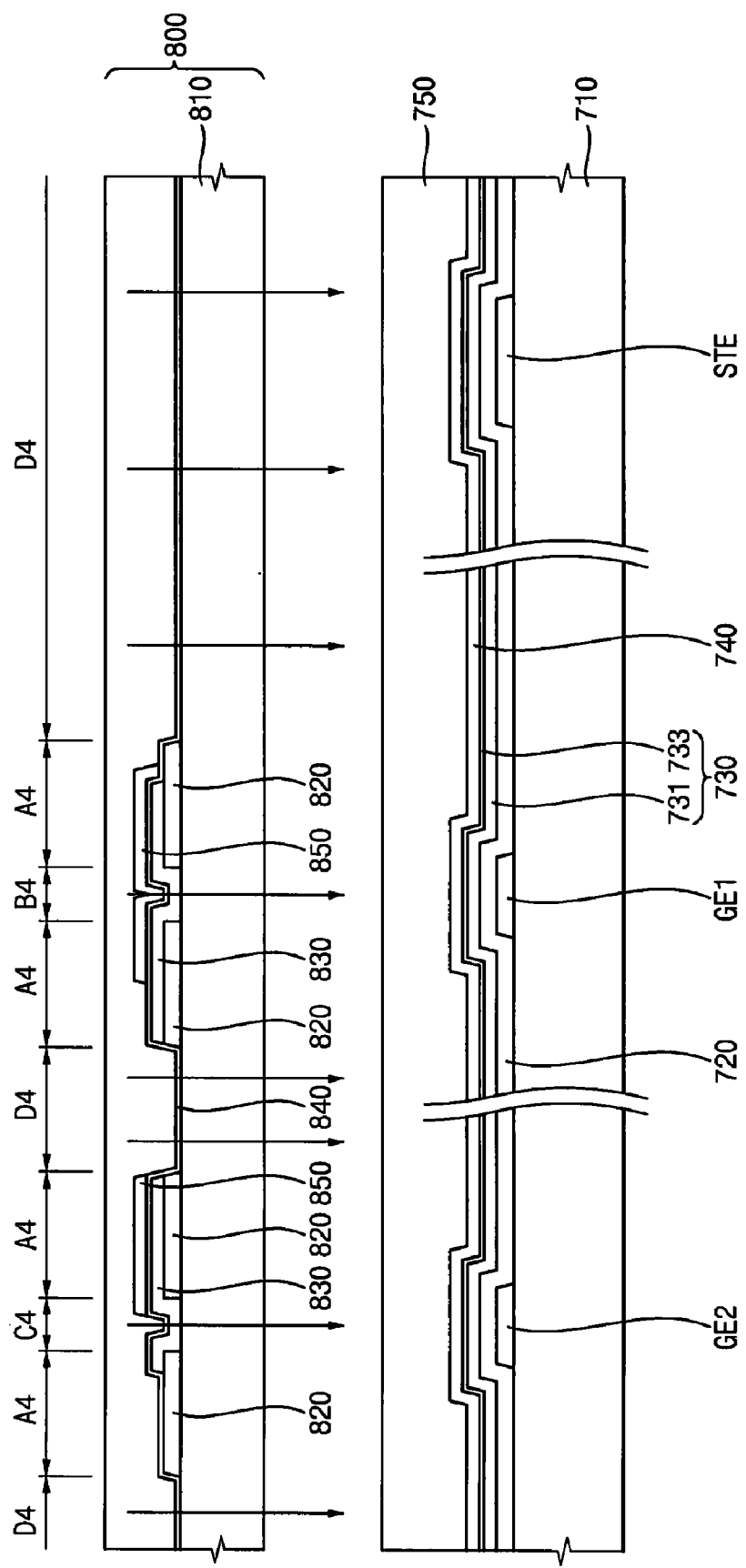
FIGS. 7 through 12 are cross-sectional views illustrating a method of manufacturing the thin-film transistor substrate illustrated in FIG. 5.
Figure 8:
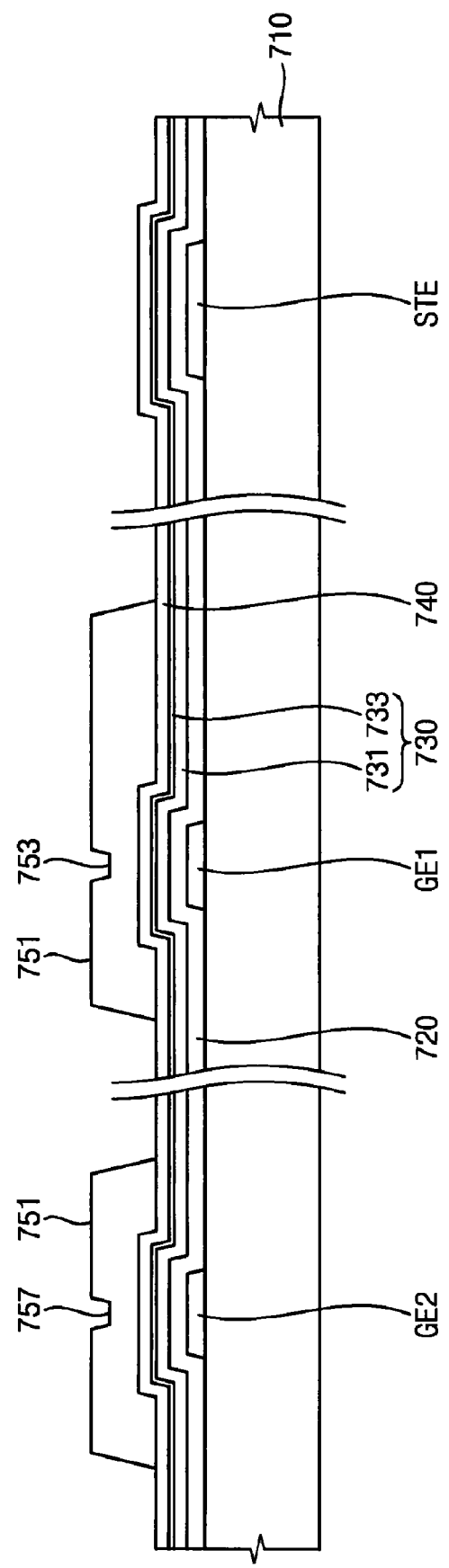

Referring to FIG. 7, a gate metal layer is formed on a substrate 710 through, for example, a sputtering process and then patterned through a photolithography process to form a plurality of gate lines GL and a gate line pattern. The gate line pattern includes a first gate electrode GE1, a second electrode GE2 and a storage line STL. The first and second electrodes GE1 and GE2 are extended from each of the gate lines GL. The storage line STL includes a storage electrode STE.

A gate insulation layer 720 is formed to insulate the gate lines GL, a first gate electrode GE1 and the second gate electrode GE2. Examples of a material that may be used for the gate insulation layer 720 may include silicon nitride (SiNx). An active layer 730 is formed on the gate insulation layer 720. The active layer 730 may include a semiconductor layer 731 and a contact layer 733 formed on the semiconductor layer 731. The semiconductor layer 731 may include an amorphous silicon, and the contact layer 733 may include an $n^+$ amorphous silicon, into which impurities are doped at a high concentration. A source metal layer 740 is formed on the active layer 730. Examples of a material that may be used for the source metal layer 740 may include a conductive metal such as molybdenum, aluminum, chromium, copper, an alloy thereof. A photoresist layer 750 is formed on the source metal layer 740.

Particularly, a photoresist composition is coated on the source metal layer 740, and then pre-baked at about 70 to about 110° C. for about 1 to 15 minutes to form the photoresist layer 750. In this exemplary embodiment, the photoresist composition is a positive photoresist composition. Thus, a portion of the photoresist layer 750, which is exposed to light, may be removed by a developing solution.

The photoresist layer 750 is exposed to light by using a first multi-tone optical mask 800. The first multi-tone optical mask 800 includes a substrate 810, a light-blocking pattern 820, a first semi-transmitting pattern 830, an etch-stopping layer 840 and a second semi-transmitting pattern 850.

The light-blocking pattern 820 corresponds to the first gate electrode GE1, the second gate electrode GE2 and the data line DL. A portion of the light-blocking pattern 820, which corresponds to a central portion of the first gate electrode GE1 (referred as to a first channel area 753 hereinafter) and a central portion of the second gate electrode GE2 (referred as to a second channel area 757 hereinafter), is opened.

The first semi-transmitting pattern 830 is partially overlapped with the light-blocking pattern 820. The first semi-transmitting pattern 830 is formed on the substrate 810 and corresponds to the first and second channel areas 753 and 757. Alternatively, the first semi-transmitting pattern 830 may not be overlapped with the light-blocking pattern 820. The etch-stopping layer 840 covers the substrate 810 having the first semi-transmitting pattern 830. The second semi-transmitting pattern 850 is partially overlapped with the first semi-transmitting pattern 830. The second semi-transmitting pattern 850 corresponds to the first channel area 753.

Thus, the first multi-tone optical mask 800 has a first area A4 corresponding to the light-blocking pattern 820, a second area B4 corresponding to the first channel area 753 and having the first and second semi-transmitting patterns 830 and 850, a third area C4 corresponding to the second channel area 757 and having the first semi-transmitting pattern 830 and a fourth area D4 corresponding to an exposed portion of the substrate 850. The first multi-tone optical mask 800 may further have a fifth area corresponding to a remaining portion of the second semi-transmitting pattern 850 except for first and second areas A4 and B4.

The first area A4 has a first light-transmittance of about 0%, and the fourth area D4 has a fourth light-transmittance of about 100%. When a light-transmittance of the first semi-transmitting pattern 830 is about x %, and when a light-transmittance of the second semi-transmitting pattern 850 is about y %, the second area B4 has a second light-transmittance of about xy %, and the third area C4 has a third light-transmittance of about x %. Thus, the third light-transmittance is greater than the second light-transmittance.

Referring to FIG. 5, a pattern density of the first thin-film transistors TFT1 and the data lines DL in the display area is smaller than that of the second thin-film transistors TFT2 and/or circuit patterns in the gate driver 501.

When a remaining photoresist layer 751 is formed according to a conventional method of manufacturing a thin-film transistor substrate, a line pattern formed under the remaining photoresist layer 751 may be non-uniform depending on disposition of the line pattern on the substrate 710. Thus, an exposure amount of the photoresist layer 750 may be varied in view of the disposition of the line pattern. For example, the exposure amount of the photoresist layer 750 corresponding to the gate driver 501 having a relatively great pattern density may be greater than that of the photoresist layer 750 corresponding to the display area.

In this exemplary embodiment, the first thin-film transistor TFT1 may have a shape substantially the same as the second thin-film transistor TFT2. However, when a pattern density of the second thin-film transistor TFT2 is greater than that of the first thin-film transistor TFT1, an exposure amount of the second thin-film transistor TFT2 may be greater than that of the first thin-film transistor TFT1.

Referring to FIGS. 6 and 7, the first area A4 corresponds to the first source electrode SE1, the first drain electrode DE1, the second source electrode SE2 and the data lines DL. The second area B4 corresponds to the first channel area 753. The third area C4 corresponds to the second channel portion 757. The fourth area D4 corresponds to a remaining area of the substrate 710 except for the first, second and third areas A4 B4 and C4. When the first multi-tone optical mask 800 has a fifth area corresponding to a remaining area of the peripheral area except for the first, second and third areas A4 B4 and C4, the fourth area D4 may correspond to a remaining area of the display area except for the first, second and third areas A4, B4 and C4.

When the photoresist layer 750 is exposed to light and then developed using the first multi-tone optical mask 800, a portion of the photoresist layer 750 corresponding to the first area A4 is remained without reducing the thickness. However, a portion of the photoresist layer 750 corresponding to the second and third areas B4 and C4 is partially reacted with the light so that the thickness of the portion of the photoresist layer 750 is reduced.

Since a portion of the photoresist layer 750 corresponding to the fourth area D4 is entirely exposed to the light, the portion of the photoresist layer 750 is entirely removed. According to the above, an exposure amount of the second area B4 may be theoretically smaller than that of the third area C4. However, a pattern density of the second thin-film transistor TFT2 is greater than that of the first thin-film transistor TFT1 so that the second light-transmittance is substantially the same as the third light-transmittance. Thus, a thickness of a remaining photoresist layer 750 in the second area B4 may be substantially the same as that in the third area C4. Alternatively, a material and a thickness of the first and second semi-transmitting patterns 830 and 850 may be properly adjusted such that the thickness of the remaining photoresist layer 750 in the second area B4 is substantially the same as that in the third area C4.

Figure 9:
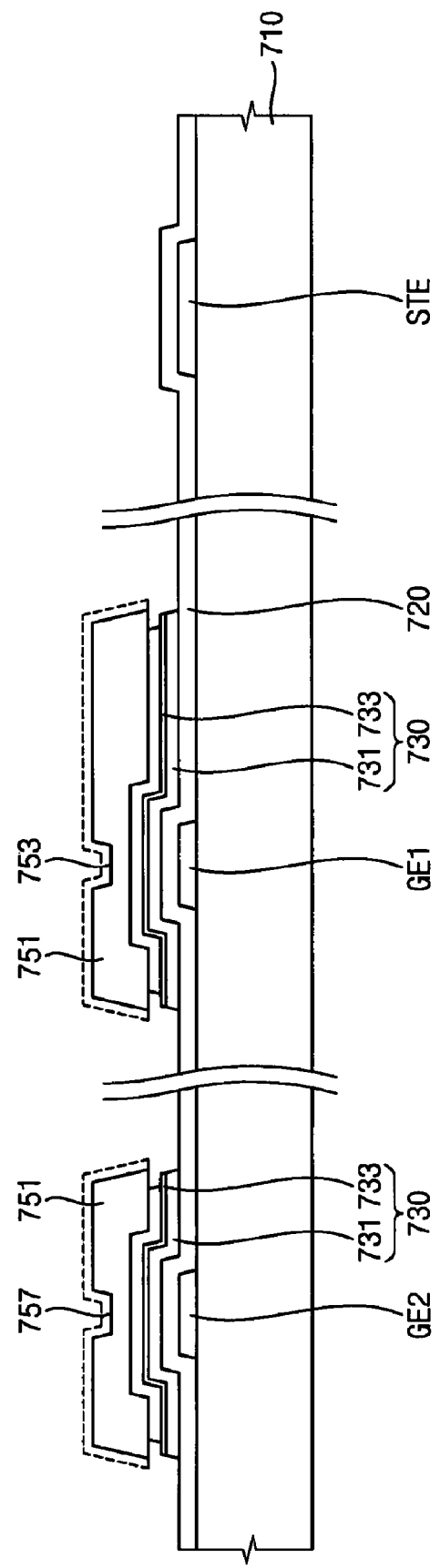

Referring to FIG. 9, the source metal layer 740 exposed in the fourth area D4 is etched by, for example, an etchant using a remaining photoresist layer 751 as a mask to expose a portion of the active layer 730. An exposed portion of the active layer 730 is etched through a dry-etching process. A portion of the remaining photoresist layer 751 is removed when the active layer 730 is etched.

Figure 10:
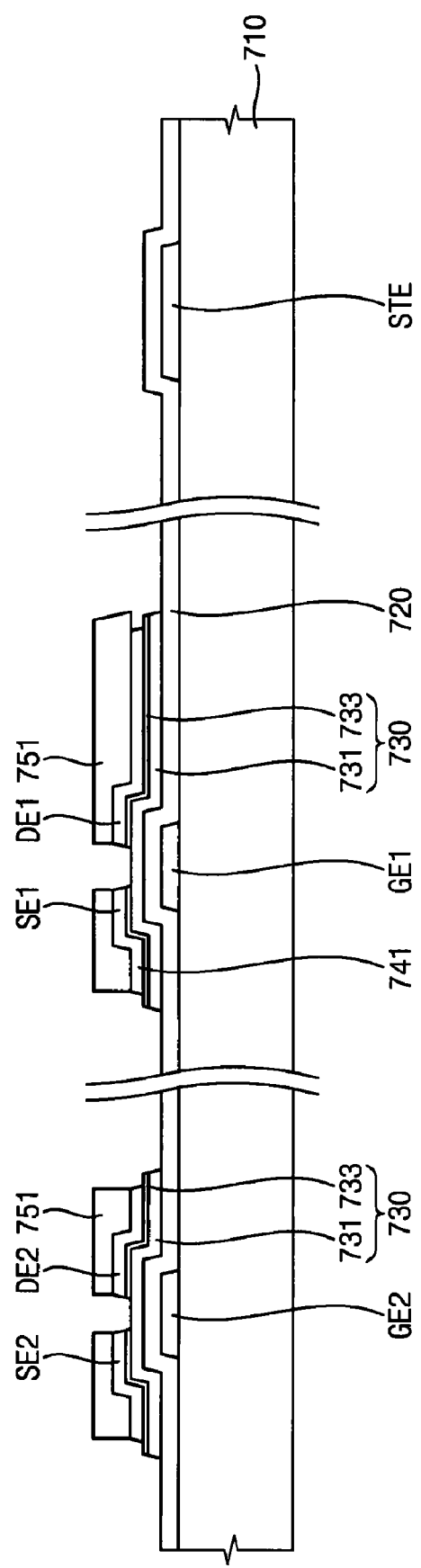

Referring to FIG. 10, the remaining photoresist layer 751 is firstly stripped through, for example, an ashing process using an oxygen plasma. As a result, a portion of the remaining photoresist layer 751 in the first and second channel areas 753 and 757 is removed, and a thickness of a remaining portion of the remaining photoresist layer 751 is reduced.

When the thickness of the remaining photoresist layer 751 in the first and second channel areas 753 and 757 is non-uniform, a residue may be caused after the ashing process.

In this exemplary embodiment, the first multi-tone optical mask 800 has light-transmittances different from each other so that the thickness of the remaining photoresist layer 751 in the first and second channel areas 753 and 757 is uniform. Therefore, the remaining photoresist layer 751 in the first and second channel areas 753 and 757 may be uniformly removed.

The source metal layer 740 exposed through the first and second channel areas 753 and 757 is etched using, for example, an etchant. As a result, a source line pattern is formed. The source line pattern includes the first source electrode SE1, the first drain electrode DE1, the second source electrode SE2 and the second drain electrode DE2. The contact layer 733 exposed between the first source electrode SE1 and the first drain electrode DE1 and between the second source electrode SE2 and the second drain electrode DE2 is etched through a dry-etching process. When the contact layer 733 is etched, a portion of the semiconductor layer 731 may be removed.

Figure 11:
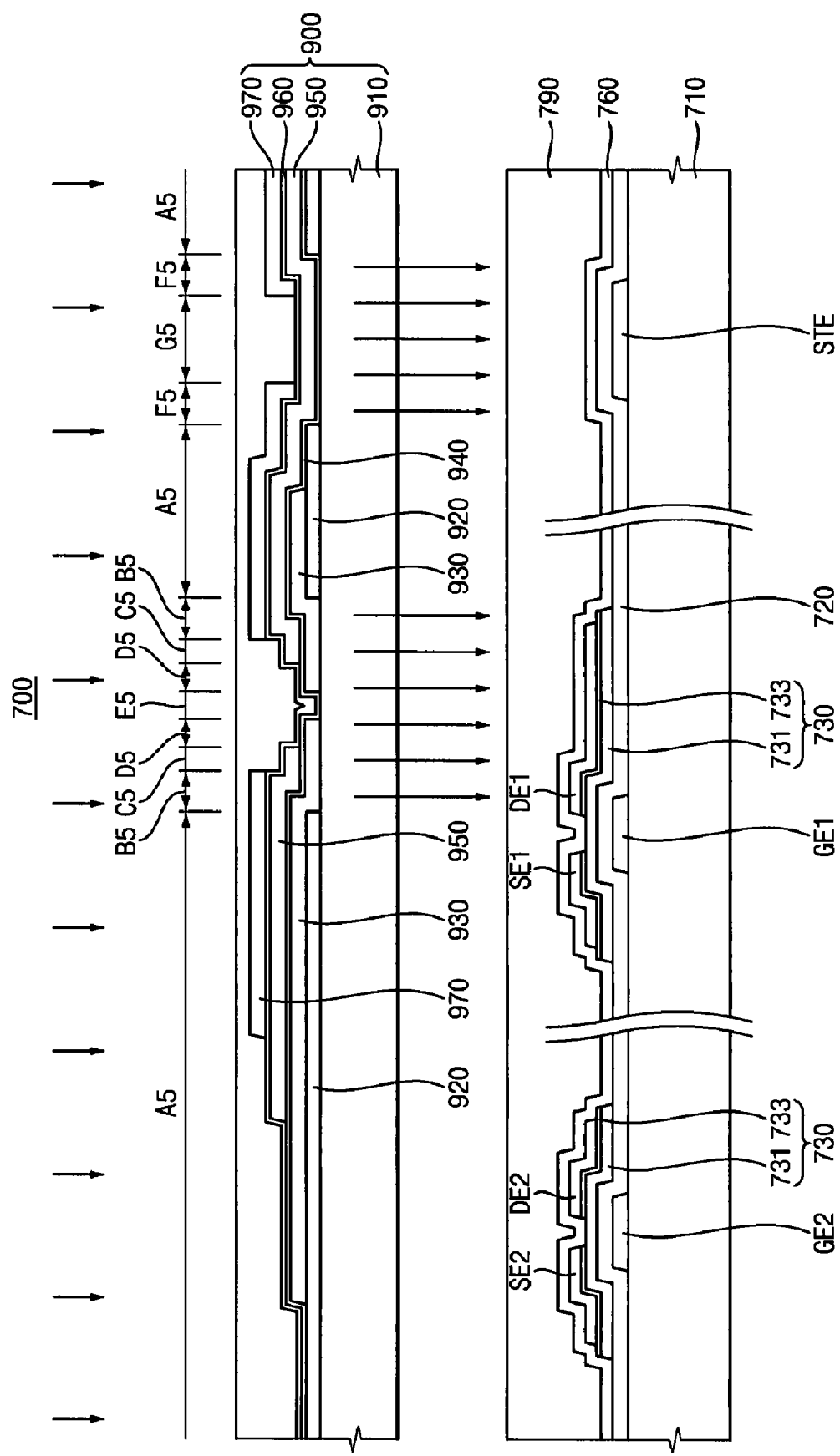

FIG. 11 is a cross-sectional view illustrating a process of exposing an organic insulation layer to light by using a second multi-tone optical mask.

Referring to FIG. 11, the remaining photoresist layer 751 is entirely removed through an ashing process using an oxygen plasma. The active layer 730 is not substantially etched since a selective etching ratio of the active layer 730 with respect to the oxygen plasma is relatively great.

Figure 12:
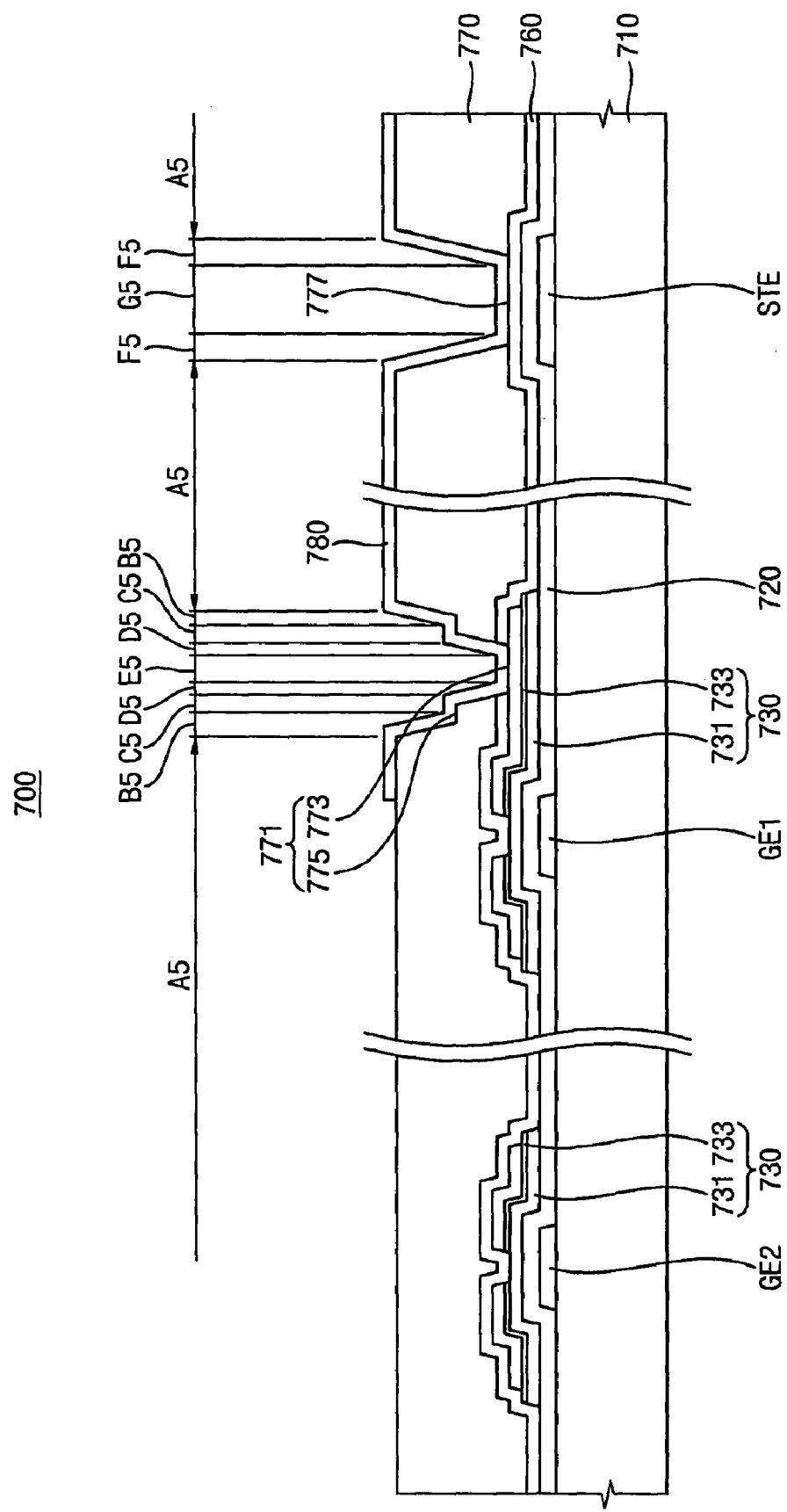

A passivation layer 760 is formed to cover the first and second thin-film transistors TFT1 and TFT2. An organic insulation layer 790 is formed on the passivation layer 760 to planarize the thin-film transistor substrate 700. Referring to FIG. 12, the organic insulation layer 790 is exposed to light by using a second multi-tone optical mask 900 and then developed to form an organic insulation pattern 770.

The second multi-tone optical mask 900 includes a substrate 910, a light-blocking pattern 920, a first semi-transmitting pattern 930, a second semi-transmitting pattern 950 and a third semi-transmitting pattern 970. The second multi-tone optical mask 900 may further include a first etch-stopping layer 940 formed between the first and second semi-transmitting patterns 930 and 950 and a second etch-stopping layer 960 formed between the second and third semi-transmitting patterns 950 and 970.

The light-blocking pattern 920, the first semi-transmitting pattern 930, the second semi-transmitting pattern 950 and the third semi-transmitting pattern 970 are sequentially formed, and are partially overlapping each other to define nine areas having different light-transmittances. However, seven areas of the nine areas are illustrated in FIG. 11.

A first area A5 corresponds to the light-blocking pattern 920. A second area B5 corresponds to a portion of the first semi-transmitting pattern 930, which is overlapped with the second and third semi-transmitting patterns 950 and 970. A third area C5 corresponds to a portion of the first semi-transmitting pattern 930, which overlaps the second semi-transmitting pattern 950. A fourth area D5 corresponds to a remaining portion of the first semi-transmitting pattern 930 except for the first, second and third areas A5, B5 and C5. A fifth area E5 corresponds to a remaining portion of the substrate except for the first, second, third and fourth areas A5, B5, C5 and D5. A sixth area F5 corresponds to a portion of the second semi-transmitting pattern 950, which overlaps the third semi-transmitting pattern 970. A seventh area G5 corresponds to a remaining portion of the second semi-transmitting pattern 950 except for the first, second, third and sixth areas A5, B5, C5 and F5.

The second multi-tone optical mask 900 may further include an eighth area (not shown) corresponding to a portion of the first semi-transmitting pattern 930, which overlaps the third semi-transmitting pattern 970 and a ninth area (not shown) corresponding to a portion of the third semi-transmitting pattern 970 except for the first, second, sixth and eighth areas.

The first area A5 is non-transmissive. A light-transmittance of the fifth area E5 is about 100%. As the number of overlapped semi-transmitting patterns is increased, a light-transmittance is reduced.

The second multi-tone optical mask 900 is disposed on the substrate 710 such that the second, third, fourth and fifth areas B5, C5, D5 and E5 are overlapped with a portion of the first drain electrode DE1 and the sixth and seventh areas F5 and G5 overlap a portion of the storage electrode STE. Thereafter, the organic insulation layer 790 is exposed to light and then developed to form the organic insulation pattern 770, as illustrated in FIG. 12.

Particularly, portions of the organic insulation layer 790 and the passivation layer 760 corresponding to the fifth area E5 may be entirely removed. A portion of the organic insulation layer 790 corresponding to the second and fourth areas B5 and D5 is slantly etched. A thickness of a portion of the organic insulation layer 790 corresponding to the third area C5 is reduced. As a result, a first contact hole 771 having two steps 773 and 775 is formed through the organic insulation layer 790.

A portion of the organic insulation layer 790 corresponding to the seventh area G5 is removed, and a portion of the organic insulation layer 790 corresponding to the sixth area F5 is slantly etched. As a result, a second contact hole 777 is formed on the storage electrode STE.

A portion of the organic insulation layer 790 corresponding to the second area B5 is remained. Auxiliary contact holes (not shown) having a plurality of steps may be further formed through the organic insulation layer 790.

A transparent conductive material such as indium zinc oxide (IZO), indium tin oxide (ITO) is deposited on the organic insulation pattern 770 and then patterned through a photolithography to form a pixel electrode 780. The pixel electrode 780 extends into the first contact hole 771 and is electrically connected to the first drain electrode DE1. Furthermore, the pixel electrode 780 extends into the second contact hole 777 to form a storage capacitor with the storage electrode STE, the gate insulation layer 720 and the passivation layer 760.

In this exemplary embodiment, a thin-film pattern having a multi-step, such as the organic insulation pattern 770, may be formed using a multi-tone optical mask having at least seven light-transmittances different from each other, such as the second multi-tone optical mask 900.

Furthermore, when the thin-film pattern having the multi-step is formed, the multi-step may be non-uniform depending on a shape of a step, a disposition density of the step and an area of a substrate. However, when a photoresist layer is exposed to light by using the multi-tone optical mask having a plurality of tones properly corresponding to areas of the substrate, a uniform step may be formed.

According to the above, an exposure amount of a photoresist layer may be adjusted according to an area of a substrate. Thus, a thin-film pattern having a multi-step may be formed using one mask so that a manufacturing efficiency is improved.

Furthermore, when the photoresist layer is exposed to light by using a multi-tone optical mask having a plurality of tones properly corresponding to a plurality of areas of the substrate, a uniform step may be formed. Thus, a manufacturing yield of a TFT substrate may be increased.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A multi-tone optical mask comprising:
   a substrate;
   a light-blocking pattern formed on the substrate;
   a first semi-transmitting pattern having a light-transmittance of a first value, and being formed on the substrate;
   a second semi-transmitting pattern having a light-transmittance of a second value different from the first value, the second semi-transmitting pattern having a first portion overlapping the first semi-transmitting pattern and a second portion formed on the substrate; and
   a first etch-stopping layer covering an entire surface of the substrate including the light-blocking pattern and the first semi-transmitting pattern, wherein the second semi-transmitting pattern is formed on the first etch-stopping layer.

2. The multi-tone optical mask of claim 1, further comprising a third semi-transmitting pattern having a light-transmittance of a third value different than the first and second light-transmittance values, wherein the third semi-transmitting pattern has a first portion overlapping a portion of the first and second semi-transmitting patterns, a second portion which overlaps only a portion of the first semi-transmitting pattern, a third portion which overlaps only a portion of the second semi-transmitting pattern, and a fourth portion which overlaps only a portion of the substrate.

3. The multi-tone optical mask of claim 2, wherein the first etch-stopping layer further comprises at least one of a first portion and a third portion, the first portion being formed between the light-blocking pattern and the first semi-transmitting pattern, the third portion being formed between the second semi-transmitting pattern and third semi-transmitting pattern.

4. The multi-tone optical mask of claim 2, wherein the light-blocking pattern comprises chromium.

5. The multi-tone optical mask of claim 2, wherein a composition of each of the first, second and third semi-transmitting patterns comprise at least one material selected from the group consisting of chromium oxide, chromium nitride, chromium oxide nitride and molybdenum silicide.

6. The multi-tone optical mask of claim 1, wherein the substrate includes:
a first area corresponding to the light-blocking pattern having a first light-transmittance;
a second area corresponding to the portion of the first semi-transmitting pattern, which overlaps with the second semi-transmitting pattern, having a second light-transmittance;
a third area corresponding to the portion of the first semi-transmitting pattern formed on the substrate having a third light-transmittance;
a fourth area corresponding to the portion of the second semi-transmitting pattern formed on the substrate having fourth light-transmittance; and
a fifth area corresponding to an exposed portion of the substrate having a fifth light-transmittance.

7. The multi-tone optical mask of claim 1, further comprising a protecting layer covering the light-blocking pattern, the first semi-transmitting pattern and the second semi-transmitting pattern.

8. The multi-tone optical mask of claim 1, wherein a portion of the first semi-transmitting pattern overlaps with the light-blocking pattern.

9. The multi-tone optical mask of claim 1, wherein at least a portion of the first semi-transmitting pattern is disposed on the light-blocking pattern, and a portion of the second semi-transmitting pattern is disposed on the first semi-transmitting pattern.

10. The multi-tone optical mask of claim 9, wherein a composition of the first semi-transmitting pattern comprises molybdenum silicide, and a composition of the second semi-transmitting pattern comprises at least one material selected from the group consisting of chromium oxide, chromium nitride and chromium oxide nitride.

11. The multi-tone optical mask of claim 10, further comprising a second etch-stopping layer and a third semi-transmitting pattern formed on the second etch-stopping layer, the second etch-stopping layer covering the light-blocking pattern, the first semi-transmitting pattern and the second semi-transmitting pattern, wherein a composition of the third semi-transmitting pattern comprises at least one material selected from the group consisting of chromium oxide, chromium nitride and chromium oxide nitride.

12. The multi-tone optical mask of claim 1, wherein at least a portion of the light-blocking pattern is disposed on the first semi-transmitting pattern and/or the second semi-transmitting pattern.

13. A method of manufacturing a multi-tone optical mask, the method comprising:
forming a light-blocking pattern on a substrate;
forming a first semi-transmitting pattern formed on the substrate;
forming a first etch-stopping layer on an entire surface of the substrate including the light-blocking pattern and the first semi-transmitting pattern to cover the entire surface of the substrate; and
forming a second semi-transmitting pattern on the substrate including the first etch-stopping layer, the second semi-transmitting pattern having a first portion which overlaps the first semi-transmitting pattern, and a second portion which overlaps a portion of the substrate.

14. The method of claim 13, further comprising forming a third semi-transmitting pattern having a first portion which overlaps a portion of the first and second semi-transmitting patterns, a second portion which overlaps only a portion of the first semi-transmitting pattern, a third portion which overlaps only a portion of the second semi-transmitting pattern, and a fourth portion which only overlaps a portion of the substrate.

15. The method of claim 14, wherein the first etch-stopping layer further comprises at least one of a first portion and a third portion, the first portion being formed between the light-blocking pattern and the first semi-transmitting pattern, the third portion being formed between the second semi-transmitting pattern and third semi-transmitting pattern.

16. The method of claim 14, wherein the light-blocking pattern, the first semi-transmitting pattern, the second semi-transmitting pattern and the third semi-transmitting pattern are sequentially formed on the substrate.

17. The method of claim 14, further comprising sequentially depositing a light-blocking layer, a first semi-transmitting layer, a second semi-transmitting layer and a third semi-transmitting layer on the substrate, wherein the third semi-transmitting pattern, the second semi-transmitting pattern, the first semi-transmitting pattern and the light-blocking pattern are sequentially formed.

18. The method of claim 14, wherein the multi-tone optical mask has;
a first area corresponding to a portion of the light-blocking pattern having a first light-transmittance;
a second area corresponding to an exposed portion of the substrate to have a second light-transmittance; and
at least three areas of a third area corresponding to a portion of the first semi-transmitting pattern, which overlaps the second semi-transmitting pattern, a fourth area corresponding to a portion of the first semi-transmitting pattern, which overlaps the second and third semi-transmitting patterns, a fifth area corresponding to a portion of the first semi-transmitting pattern, which overlaps the third semi-transmitting pattern, a sixth area corresponding to a remaining portion of the first semi-transmitting pattern except for the first, third, fourth and fifth areas, a seventh area corresponding to a portion of the second semi-transmitting pattern, which overlaps the third semi-transmitting pattern, an eighth area corresponding to a remaining portion of the second semi-transmitting pattern except for the first, third, fourth and seventh areas and a ninth area corresponding to a remaining portion of the third semi-transmitting pattern except for the first, fourth, fifth and seventh areas.

19. The method of claim 13, further comprising forming a protecting layer covering the light-blocking pattern, the first semi-transmitting pattern and the second semi-transmitting pattern.

20. The method of claim 13, wherein a portion of the first semi-transmitting pattern overlaps with the light-blocking pattern.

21. The method of claim 13, wherein at least a portion of the first semi-transmitting pattern is disposed on the light-blocking pattern, and a portion of the second semi-transmitting pattern is disposed on the first semi-transmitting pattern.

22. The method of claim 21, wherein a composition of the first semi-transmitting pattern comprises molybdenum silicide, and a composition of the second semi-transmitting pattern comprises at least one material selected from the group consisting of chromium oxide, chromium nitride and chromium oxide nitride.

23. The method of claim 22, further comprising:
forming a second etch-stopping layer covering the light-blocking pattern, the first semi-transmitting pattern and the second semi-transmitting pattern; and
forming a third semi-transmitting pattern disposed on the second etch-stopping layer, wherein a composition of the third semi-transmitting pattern comprises at least one material selected from the group consisting of chromium oxide, chromium nitride and chromium oxide nitride.

24. The method of claim 13, wherein at least a portion of the light-blocking pattern is disposed on the first semi-transmitting pattern and/or the second semi-transmitting pattern.

25. The method of claim 24, wherein the first semi-transmitting pattern, the light-blocking pattern and the second semi-transmitting pattern are sequentially formed on the substrate.

26. The method of claim 24, wherein the first semi-transmitting pattern, the second semi-transmitting pattern and the light-blocking pattern are sequentially formed on the substrate.

27. The method of claim 24, further comprising:
sequentially depositing a first semi-transmitting layer and a light-blocking layer;
sequentially etching the light-blocking layer and the first semi-transmitting layer;
depositing a second semi-transmitting layer covering the light-blocking pattern and the first semi-transmitting pattern; and
etching the second semi-transmitting layer.

* * * * *